(12) United States Patent
Goodman et al.

(10) Patent No.: US 11,483,952 B2
(45) Date of Patent: Oct. 25, 2022

(54) BROADBAND WIRELINE CABLE (71) Applicants: Halliburton Energy Services, Inc., Houston, TX (US); Dea Goodman, Houston, TX (US)

(72) Inventors: George David Goodman, Houston, TX (US); Sudhir Gupta, Kingwood, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 60 days.

(21) Appl. No.: 15/768,993

(22) PCT Filed: Apr. 28, 2017

(86) PCT No.: PCT/US2017/030262
§ 371 (c)(1),
(2) Date: Apr. 17, 2018

(87) PCT Pub. No.: WO2018/200003
PCT Pub. Date: Nov. 1, 2018

(65) Prior Publication Data
US 2019/0069453 A1   Feb. 28, 2019

(51) Int. Cl.
*H05K 9/00* (2006.01)
*H01B 7/04* (2006.01)
(Continued)

(52) U.S. Cl.
CPC ............ *H05K 9/0098* (2013.01); *C08K 3/22* (2013.01); *E21B 17/003* (2013.01); *E21B 47/12* (2013.01);
(Continued)

(58) Field of Classification Search
CPC ...... H05K 9/0098; H05K 9/0083; C08K 3/22; C08K 2003/2272; C08K 2201/01;
(Continued)

(56) References Cited

U.S. PATENT DOCUMENTS 1,972,877 A * 9/1934 Eglin ..................... H01B 11/00
333/243
4,362,899 A * 12/1982 Borrill ................. H05K 1/0219
174/36

(Continued)

FOREIGN PATENT DOCUMENTS

| CA | 2038873 | 2/1995 |
|----|---------|--------|
| CN | 105575543 | 5/2016 |

(Continued)

OTHER PUBLICATIONS

International Search Report and Written Opinion of PCT Application No. PCT/US2017/030262 dated Aug. 25, 2017: pp. 1-12.

*Primary Examiner* — Jonathan Malikasim
(74) *Attorney, Agent, or Firm* — K&L Gates LLP (57) ABSTRACT

A wireline cable, method, and system for broadband communications and data transfer. The wireline cable comprises insulated conductors, arranged such that circumferentially spaced conductors surround a central conductor. One or more of the conductors is insulated with a magnetic permeable insulation configured to reduce electrical interference with an adjacent conductor.

20 Claims, 10 Drawing Sheets

(51) Int. Cl.
  *H01B 7/22* (2006.01)
  *H01B 3/44* (2006.01)
  *C08K 3/22* (2006.01)
  *E21B 17/00* (2006.01)
  *E21B 47/12* (2012.01)
  *H01B 7/00* (2006.01)
  *H01B 11/14* (2006.01)
  *E21B 49/00* (2006.01)

(52) U.S. Cl.
  CPC ........... *H01B 3/441* (2013.01); *H01B 7/0009* (2013.01); *H01B 7/046* (2013.01); *H01B 7/226* (2013.01); *H05K 9/0083* (2013.01); *C08K 2003/2272* (2013.01); *C08K 2201/01* (2013.01); *E21B 49/00* (2013.01); *H01B 11/146* (2013.01)

(58) Field of Classification Search
  CPC ...... H01B 3/441; H01B 7/0009; H01B 7/226; H01B 7/046; H01B 11/146; E21B 47/12; E21B 17/003; E21B 49/00
  See application file for complete search history.

(56) References Cited

U.S. PATENT DOCUMENTS

| | | | |
|---|---|---|---|
| 4,565,591 A | 1/1986 | Shannon | |
| 6,469,636 B1* | 10/2002 | Baird | E21B 41/0085 340/854.9 |
| 6,999,517 B1* | 2/2006 | Bombay | E21B 47/12 340/854.9 |
| 2003/0085816 A1 | 5/2003 | Baird et al. | |
| 2005/0219063 A1* | 10/2005 | Viswanathan | G01V 1/52 340/854.9 |
| 2010/0252300 A1 | 10/2010 | Worman et al. | |
| 2011/0075978 A1 | 3/2011 | Rose | |
| 2012/0125651 A1* | 5/2012 | Pearson | H01B 7/303 174/24 |

FOREIGN PATENT DOCUMENTS

| | | |
|---|---|---|
| JP | 2012234636 | 11/2012 |
| KR | 20030081190 | 10/2003 |
| KR | 100585993 | 6/2006 |
| WO | 03088282 | 10/2003 |
| WO | 2017074453 | 5/2017 |

* cited by examiner

BROADBAND WIRELINE CABLE

BACKGROUND

This section is intended to provide relevant background information to facilitate a better understanding of the various aspects of the described embodiments. Accordingly, it should be understood that these statements are to be read in this light and not as admissions of prior art.

Many downhole oil and gas operations often utilize electronic tools to evaluate the borehole and subterranean earth formation, such as various types of wireline logging tools (e.g., nuclear magnetic resonance (NMR) logging tool, acoustic logging tools, resistive logging tools, etc.), which require power and communication capabilities. A logging sonde or well logging tool is passed through the borehole to measure the parameters or characteristics of the formations at various depths within the borehole. The logging tool can be suspended in the borehole using a wireline cable which supplies electrical power to the logging tool and provides a communication path to transmit and receive telemetry signals between the surface and the logging tool. For example, as the logging tool passes through the borehole, the data and information measured by the logging tool may be transmitted over the wireline cable to the surface for further processing and analysis.

The purpose of the wireline cables is to carry large mechanical loads while delivering power and providing communication means with downhole tools. The cable's conductor package is typically made as a group of stranded copper conductors that are electrically insulated. Wire insulation type and thickness is selected to achieve the desired mechanical properties and dielectric strength for delivering relatively high voltage power to downhole tools. Some wireline cable also functions as a multiconductor transmission line utilizing orthogonal transmission modes to transmit power and data downhole. A limitation of the orthogonal transmission modes is that conductors carrying electrical signals can produce eddy currents or conduction threads in adjacent conductors, in turn creating interference in the electrical signals carried over the cable conductors. Interference in the electrical signals may disrupt the amount of power and data that can be transmitted over the wireline cables reducing the power and communication efficiency of the wireline system. Attempts to improve the data bandwidth of the wireline cable include attempts to add parallel channels (or modes) with advanced processing methods to reject cross-mode coupling (crosstalk) and time shifted data. However, the benefits are diminished as the wireline cable length increases and approaches theoretical limits using these methods.

BRIEF DESCRIPTION OF THE DRAWINGS

Embodiments of the invention are described with reference to the following figures. The same numbers are used throughout the figures to reference like features and components. The features depicted in the figures are not necessarily shown to scale. Certain features of the embodiments may be shown exaggerated in scale or in somewhat schematic form, and some details of elements may not be shown in the interest of clarity and conciseness.

DETAILED DESCRIPTION

Figure 1A:
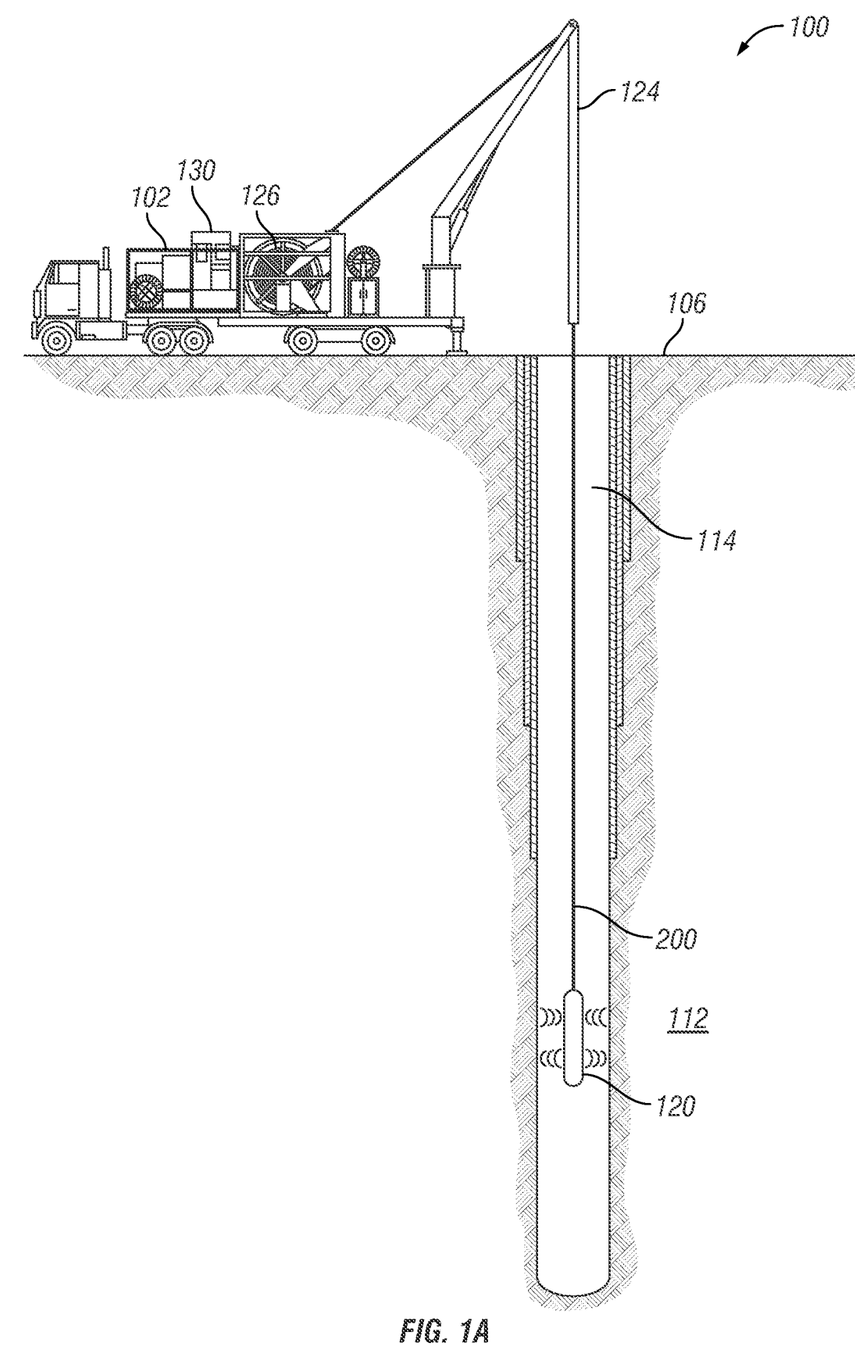
FIGS. 1A and B depict elevation views of a wireline cable system, according to one or more embodiments.

FIG. 1A depicts an elevation view of a wireline logging system 100 with a wireline cable 200 and logging tool 120, in accordance with one or more embodiments. The logging tool 120 may be an acoustic logging tool configured to measure properties of the subterranean earth formation 112 intersected by a borehole 114. The wireline cable 200 is suspended from a wireline truck 102 parked at the well site 106. The wireline truck 102 may include a wireline spool 126 which holds the wireline cable 200 for deployment downhole. The wireline truck 102 may also include a hoist 124 which suspends the wireline cable 200 and the logging tool 120 in the borehole 114. In some embodiments, the wireline cable 200 and logging tool 120 may be suspended by various other well site structures such as a rig (not shown). In other embodiments, the acoustic logging tool 800 may be a pipe conveyed logging tool, which enables logging of horizontal well sections. In the case of an offshore application, the wireline system 100 may be located on an offshore vessel or structure as further described herein with respect to FIG. 1B.

In some embodiments, the logging tool 120 is configured to emit acoustic signals in the borehole 114 through the formation. The acoustic logging tool 120 then detects the returning acoustic data signal. The returning acoustic data signal is altered from the original acoustic signal based on the mechanical properties of the formation, such as compressional velocity, shear velocity, and the like. Thus, the acoustic data signal carries such information and can be processed to evaluate the formation properties. It should be appreciated that the acoustic logging tool 120 depicted in FIG. 1A is exemplary and other suitable logging tools may be deployed in the borehole 114 using the wireline cable to measure properties of the formation 112, such as an NMR logging tool, gamma logging tool, or a resistivity logging tool.

The wireline cable 200 is coupled to a controller 130 which may be located on the wireline truck 102. The controller 130 provides power and instructions to the logging tool 120 and receives data from the logging tool 120, with the wireline cable 200 enabling communication therebetween. In some embodiments, the controller 130 is located elsewhere near the well site 106.

Figure 1B:
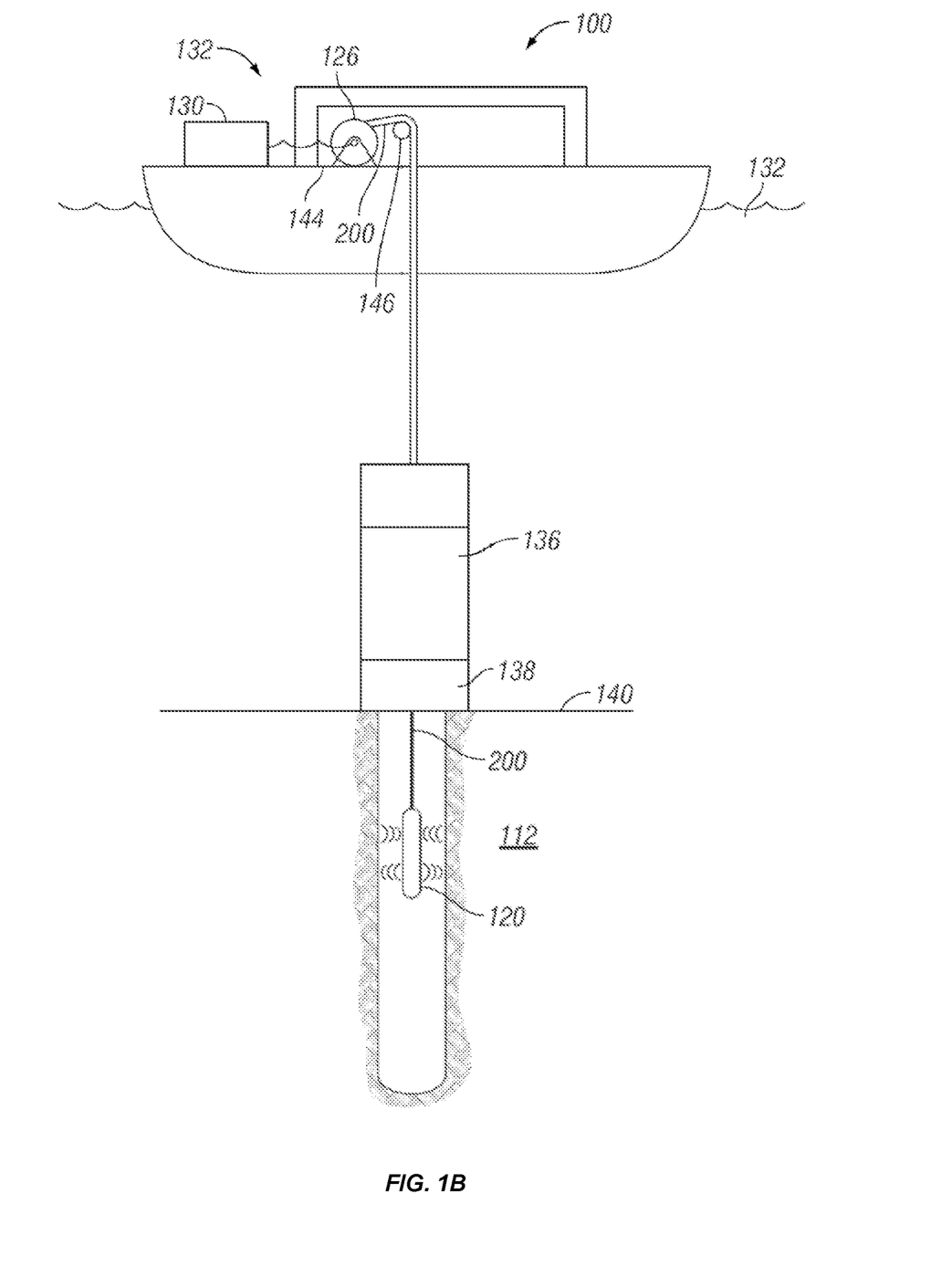

FIG. 1B depicts an elevation view of an offshore well system utilizing the wireline system 100, in accordance with one or more embodiments. A vessel 132 floating in the ocean 132 includes a wireline cable 200 extending down toward a blowout preventer stack 136. The blowout preventer stack 136 is connected with a subsea wellhead 138 installed on the seafloor 140. The wireline spool 126 and the controller 130 may be located on the deck 144 of the vessel 132 with the cable 200 extending over a pulley or sheave wheel 146 and going down to the subsea wellhead 138 to provide power and data to the logging tool 120 positioned downhole in the borehole 114.

Figure 2:
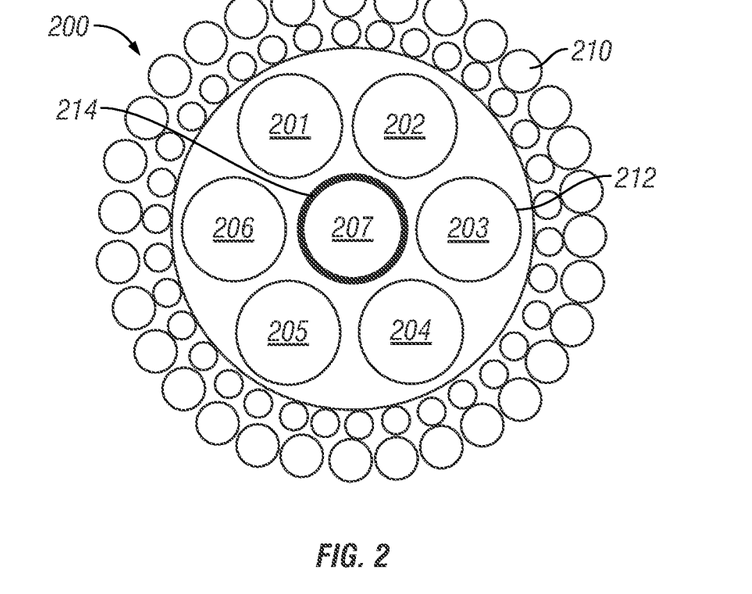
FIG. 2 depicts a cross-section view of a wireline cable, according to one or more embodiments.

The wireline cable 200 comprises multiple conductors to transmit power and provide a communication path for data. For example, FIG. 2 shows a cross-section view of the cable 200, in accordance with one or more embodiments. The cables 200 comprise two layers of contra-helically wound steel armor 210 encasing the seven electrical conductors 201-207. Each conductor 201-207 comprises copper wires surrounded by insulation 212 and one of the conductors is insulated with a magnetic permeable insulation 214 configured to reduce the attenuation of the conductors and crosstalk between adjacent conductors as further described herein. The geometry of the electrical conductors 201-207 is six conductors (201-206) wrapped around a seventh central conductor 207. The six outer conductors 201-206 are equally spaced circumferentially inside the armor 210. The seven conductors 201-206 can be wrapped with tape, around which resides the two layers of the steel wire armor 210. The steel armor 210 is conductive (1 ohm/1000 ft) and can, if necessary, be used as an eighth electrical conductor (although this undermines the safety of the system). The steel armor 210 is also ferromagnetic, and may be magnetically "marked" at regular intervals as a way of monitoring the downhole position of the downhole tool 120 of FIG. 1. Other suitable examples of the cable 200 include cables with stainless steel armor, MP35 armor, or other armors which have higher armor resistances. These cables may be preferred for corrosive drilling environments (e.g. high H2S and/or CO2 concentrations).

The magnetic permeable insulation 214 has a relative magnetic permeability of 9 to 110, 9 to 160, or 1 to 7000, to reduce the crosstalk among the conductors. Applications requiring higher dielectric strength, and lower electric permittivity, may also have a layer of electrical insulation 212 combined with a layer of the magnetic permeable insulation 214. The magnetic permeable insulation 214 may be placed above or below the electrical insulation layer; however, placing the magnetic permeable insulation 214 as the outer insulation layer can increase the inductance per unit length due to the flux path's increased cross section area.

The use of magnetic permeable insulation 214 provides a lower reluctance path for the magnetic path increasing the inductance per unit length along the conductor's length. The inductance per unit length can be further increased by increasing the thickness of the magnetic permeable insulation layer. This can be accomplished by reducing the wire gauge of the conductor insulated with the magnetic permeable material (e.g., the central conductor of FIG. 2) allowing a smaller inside diameter of the magnetic permeable insulation to be used. The outer conductors 201-206 can have a larger gauge relative to the central conductor 207 and be insulated with high dielectric strength material to facilitate power delivery in combination with providing a low resistance inner coaxial shield or current return function. Silver plating the conductors 201-207 can further minimize high frequency attenuation.

The magnetic permeable insulation material 214 can be a polymer ferrite, which may include a flexible rubber material that is impregnated with magnetically permeable filler materials (e.g., ferrite powder). The permeable insulation material 214 may be formed as sheets of flexible tape, which can be applied helically along the appropriate conductor. One function of the magnetic permeable insulation 214 is to support electromagnetic waves as they propagate on the transmission line. The magnetic permeable insulation 214 can be flexible allowing it to conform to the bending and stretching of the wireline cable 200. Cable communication bandwidth increases as the relative magnetic permeability increases of the magnetic permeable insulation, but hysteretic loss can degrade performance. Losses within the magnetic permeable insulation 214 can be minimized by filling the magnetic permeable insulation with low loss magnetic materials. The magnetic permeable insulation 214 can also be made from a polyethylene resin filled with 3F4 ferrite powder yielding a net relative magnetic permeability of 9 to 110.

The central conductor 207 being insulated with the magnetic permeable insulation 214 as shown in FIG. 2 is preferred for high frequency communication, which is defined as a frequency between 4 kHz and 300 kHz, where relatively low voltage and power (e.g., a voltage of up to 40V peak-to-peak) is applied on the central conductor 207 relative to the outer conductors 201-206. Higher voltages and power (e.g., a voltage of up to 1500V peak-to-peak) can be transferred in the outer conductors 201-206 without impacting the electrical signals being transmitted over the central conductor 207. As a result, the magnetic permeable insulation 214 on the central conductor 207 can be optimized for high frequency (wideband) communication performance.

The magnetic permeable insulation 214 may be used to reduce the attenuation and crosstalk on any combination of the available conductors as further described herein with respect to FIGS. 4A-4G. Significant improvements may be gained in reducing undesirable cross coupling between transmission modes, reduced eddy current loss due to induction fields, and lower signal attenuation resulting from the increased inductance per unit length along the cable. However, the transmission modes and their common usage can introduce undesirable effects. For example, low frequency or DC power currents can generate strong static fields that circulate within the magnetic permeable insulation limiting the magnetic permeability for higher frequency channels. Also, reducing the wire gauge of the any of the conductors to apply the magnetic permeable insulation impacts the amount of power delivery available for that respective conductor.

The wireline cable 200 may be five or more miles (40,000 feet or 12,192 meters) in length, and the electrical conductors are subject to strong capacitive and inductive coupling between conductors and between each conductor and armor. As a consequence, signals sent downhole along any two arbitrary conductors are subject to distortion, and they produce significant "crosstalk" or electrical interference on the other conductors.

To reduce the crosstalk, the conductors 201-207 may be excited based on the symmetric geometry of the cable 200. The cable 200 includes six uniform outer conductors 201-206 equally spaced from each other and equally distant from the center of the cable. By exciting symmetrically located conductors in the outer ring of six conductors with exactly chosen signal levels, the effects of inductive and capacitive coupling between conductors can be reduced. The excitation (and detection) process can be described mathematically by a set of orthogonal eigenmodes and eigenvectors. Eigenmode theory can be used to predict the relative levels of excitation (or detection) that must be imposed on each conductor in order to excite or detect one of the transmission modes. Each of the columns shown in Table I represents a particular eigenvector. The components of each vector are shown in the vertical column.

TABLE 1

|       | M1 | M2 | M3 | M4 | M5 | M6 | M7 | M8 |
|-------|----|----|----|----|----|----|----|----|
| C1    | +1 | +1 | −1 | +1 | +1 | +1 | −1 | 0  |
| C2    | +1 | 0  | −2 | −2 | 0  | −1 | −1 | 0  |
| C3    | +1 | −1 | −1 | +1 | −1 | +1 | −1 | 0  |
| C4    | +1 | −1 | +1 | +1 | +1 | −1 | −1 | 0  |
| C5    | +1 | 0  | +2 | −2 | 0  | +1 | −1 | 0  |
| C6    | +1 | +1 | +1 | +1 | −1 | −1 | −1 | 0  |
| C7    | +1 | 0  | 0  | 0  | 0  | 0  | +1 | +1 |
| Armor | 0  | 0  | 0  | 0  | 0  | 0  | 0  | −1 |

Each of the columns is an eigenvector corresponding to a signal and/or power transmission mode. Each number in the column represents the component of the eigenvector corresponding to a particular cable conductor or the armor. A positive, negative, or zero voltage (or current) may be applied to a conductor at any particular instant in time. The relative values of the components of each eigenvector indicate the ratios of voltages that must be applied to (or currents that must be induced in) each conductor in order to excite the particular signal or power transmission mode described mathematically by that eigenvector. For example, the value in column M3 in row 4 represents the level of excitation (or detection) that must be applied to conductor 204 to excite (or detect) eigenmode 3.

Figure 3A:
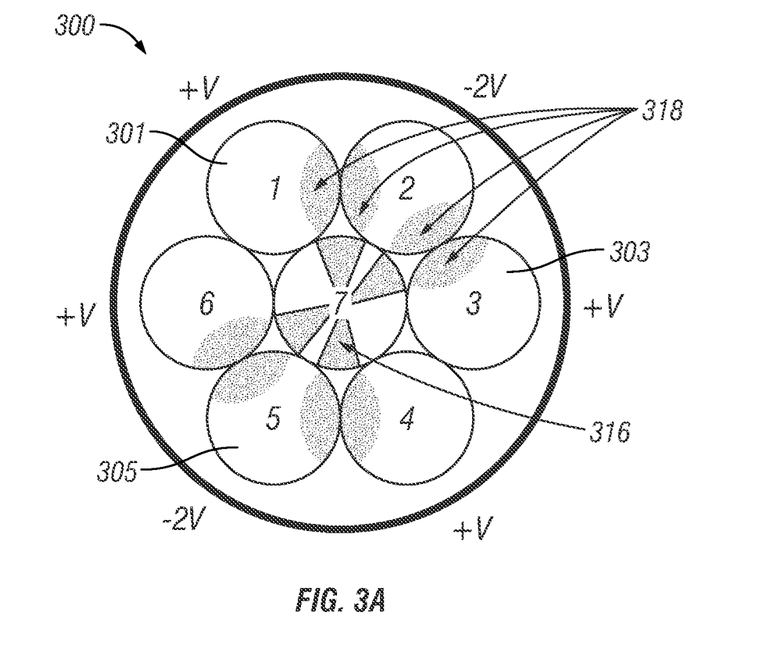
FIGS. 3A and B show cross-section views of a wireline cable operating in transmission mods M4 and M5 without a magnetic permeable insulation.
Figure 3B:
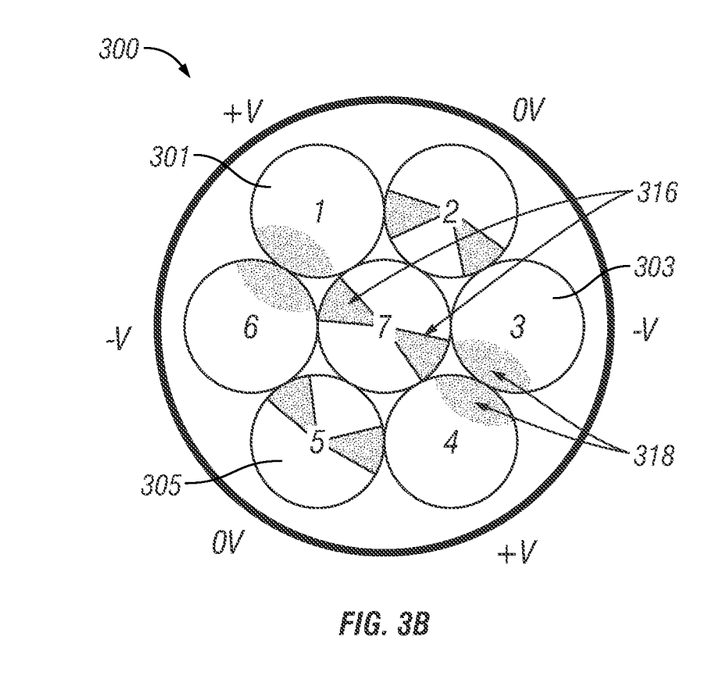

Even with the use of transmission modes, crosstalk may still be produced in a wireline cable that does not utilize the magnetic permeable insulation. For example, FIGS. 3A and 3B show the crosstalk being produced in such a wireline cable 300 for the transmission modes M4 and M5, respectively. As shown in FIGS. 3A and B, the cable 300 is being operated in transmission modes without any magnetic permeable insulation covering the conductors 301-307 to reduce the electrical interference from crossing into other conductors. While operating in the transmission modes, eddy currents 316 can develop in the conductors not being used (e.g., the conductor 207 in FIG. 4A), and current threads 318 can develop in the live conductors. The eddy currents 316 and the current threads 318 produce interference in the transmission of power and data, resulting in reduced transmission efficiency and increased attenuation along the cable 300.

Figure 4A:
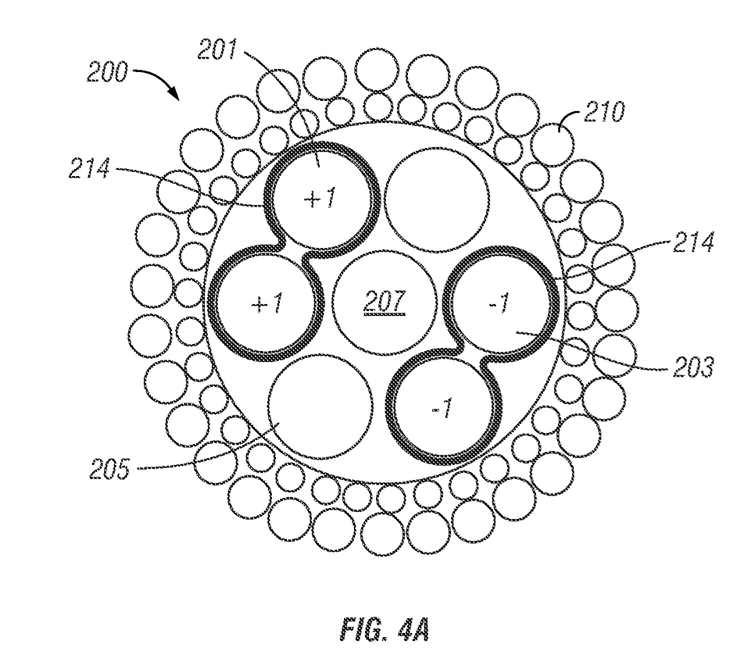
FIGS. 4A-H show cross-section views of the wireline cable of FIG. 2 operating in various transmission modes, according to one or more embodiments.
Figure 4B:
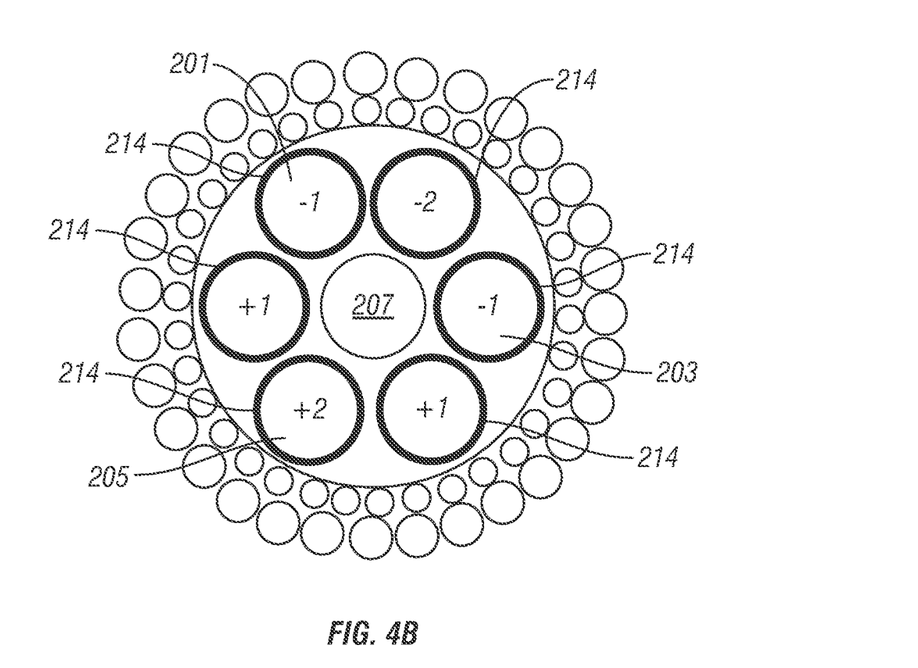
Figure 4C:
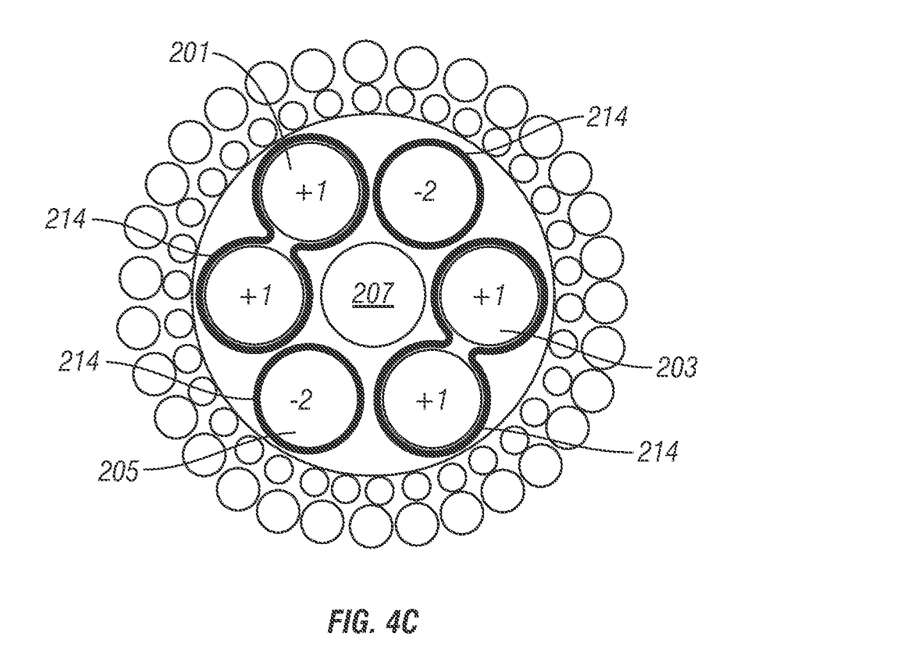
Figure 4D:
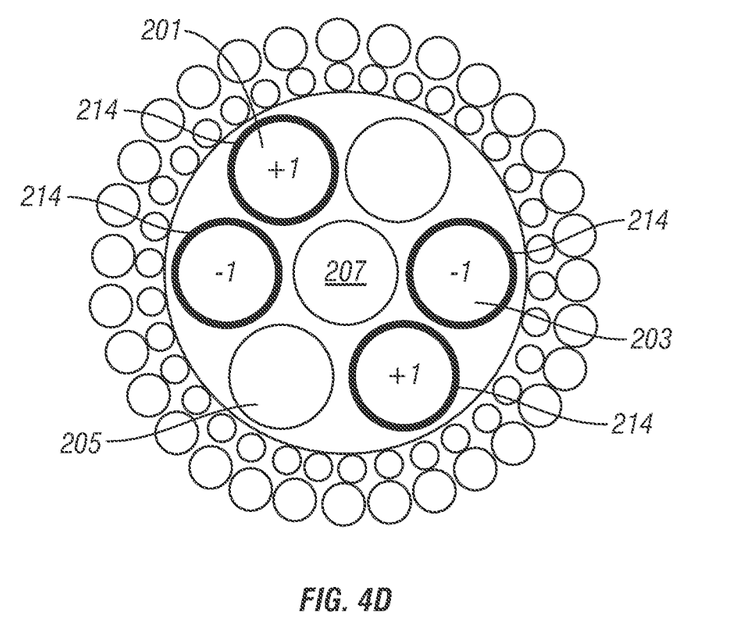
Figure 4E:
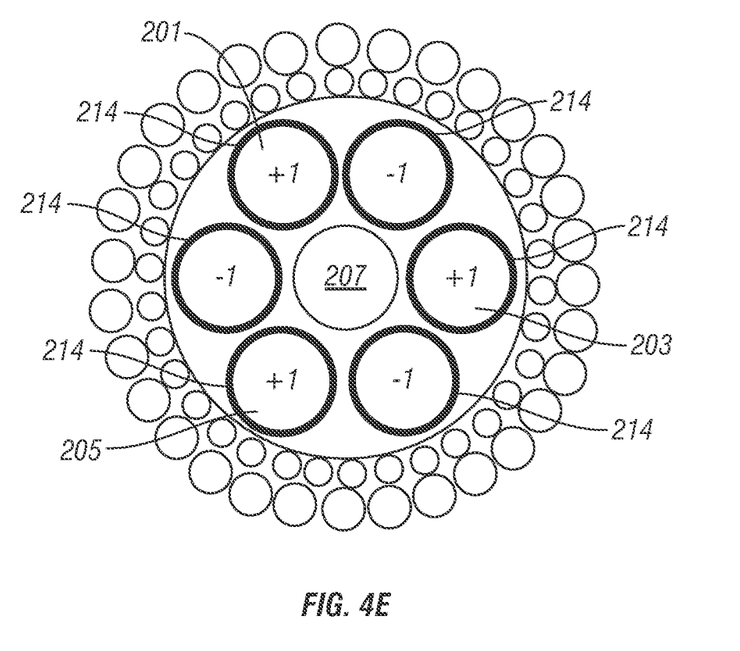
Figure 4F:
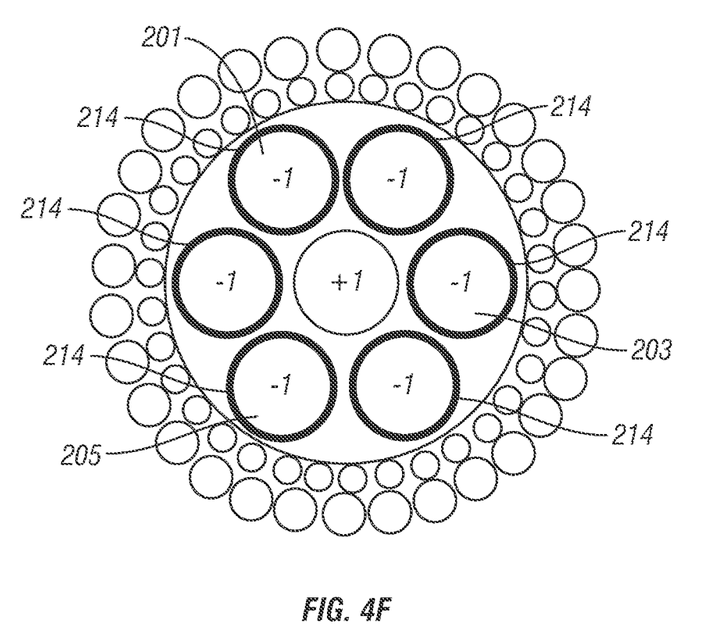
Figure 4G:
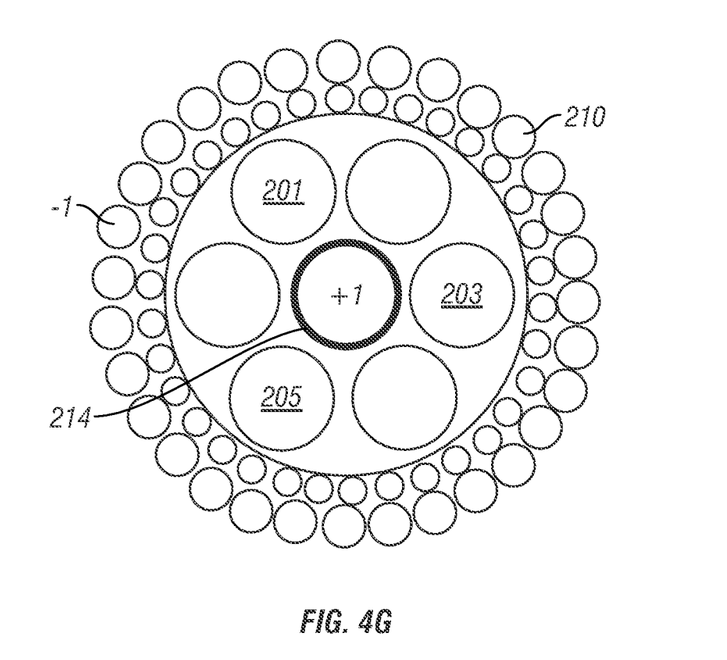

Referring to FIGS. 4A-4G, to combat these eddy currents, further reduce the crosstalk among the conductors, and reduce the attenuation experienced over miles of wireline cable, the magnetic permeable insulation 214 is applied to at least one of the conductors 201-207, depending on the transmission mode being employed. Examples of the permeable magnetic insulation 214 being applied to the conductors 201-207 for the symmetrical cable excitations modes 2-8 are shown in FIGS. 4A-4G, respectively. The first conductor 201 was chosen arbitrarily, with the subsequent conductors 202-206 being numbered in a clockwise manner. The seventh conductor 207 may be used in conjunction with the cable armor 210 as an additional signal path as depicted in FIG. 4G.

The seventh transmission mode (M7) provides a communication path offering the greatest uplink bandwidth for data to be transmitted from a downhole location to the surface, but M7 also produces the most crosstalk in the central conductor 207 without the magnetic permeable insulation 214. Therefore, the magnetic permeable insulation 214 allows the cable 200 to be used in the transmission mode M7 by reducing the crosstalk which can form across the conductors. In the transmission mode 7, the high speed uplink may use a single communication channel, which is optimized for minimum attenuation and driven with all the available signal power that may be used to drive multichannel mode configurations. Further, optimization can be achieved at the surface receiver where low noise amplifier methods can be used with minimum interfaces to minimize the receiver's noise floor.

Figure 4H:
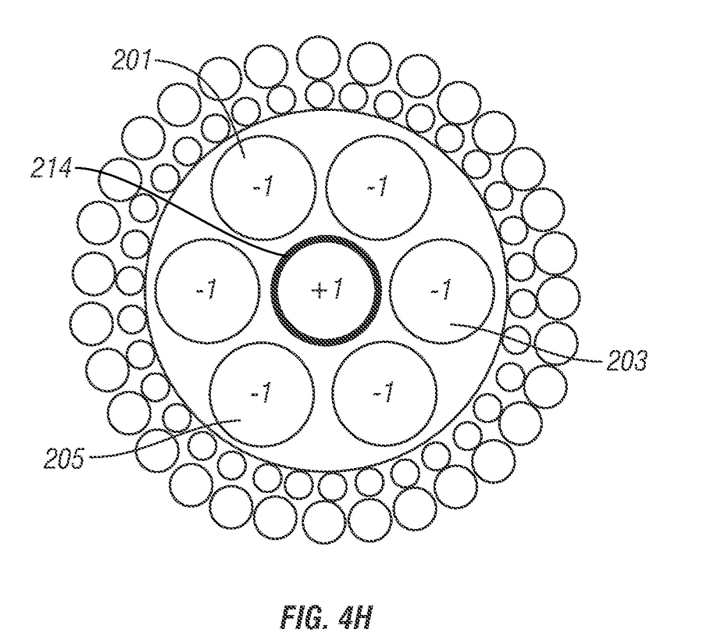
Figure 5A:
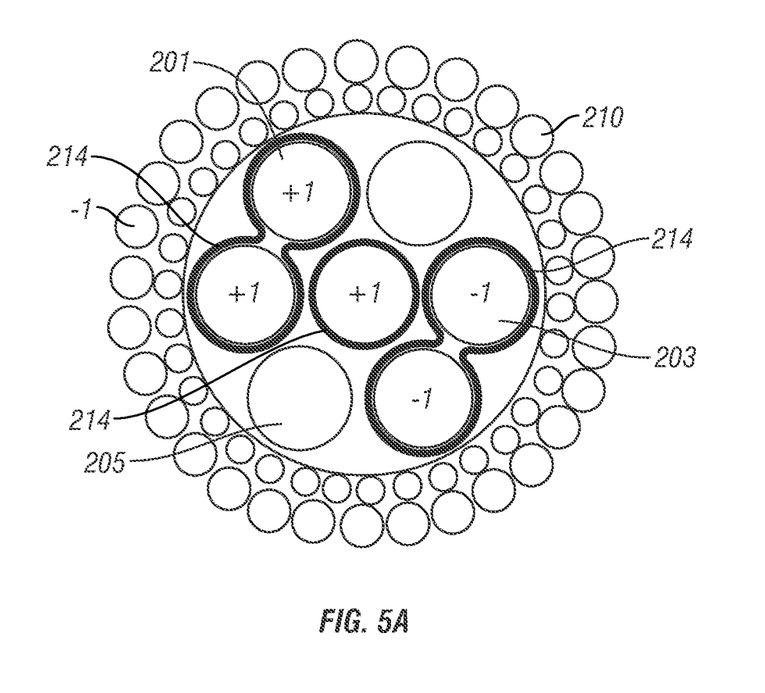
FIGS. 5A-E show cross-section views of the wireline cable FIG. 2 operating in multiple transmission modes simultaneously, according to one or more embodiments.
Figure 5B:
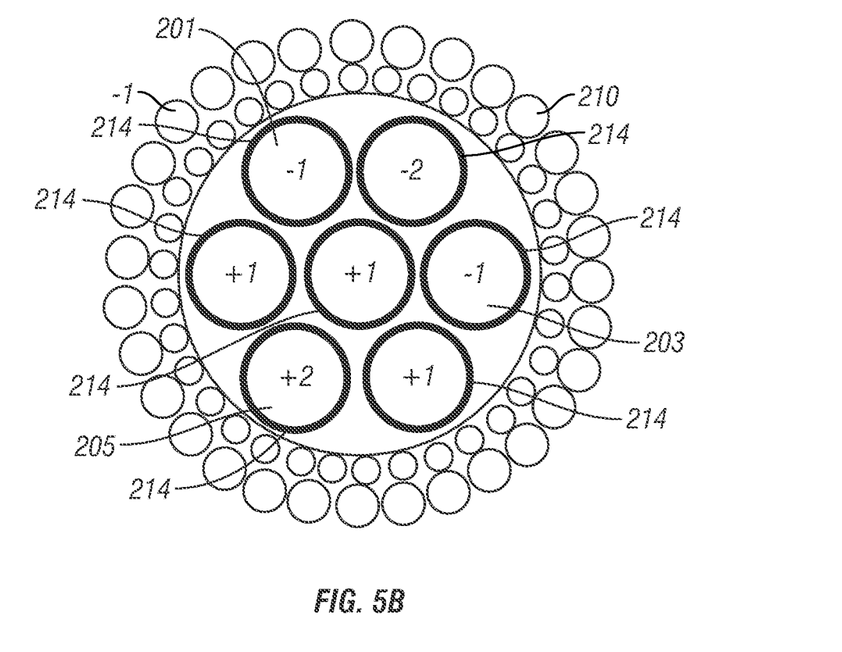
Figure 5C:
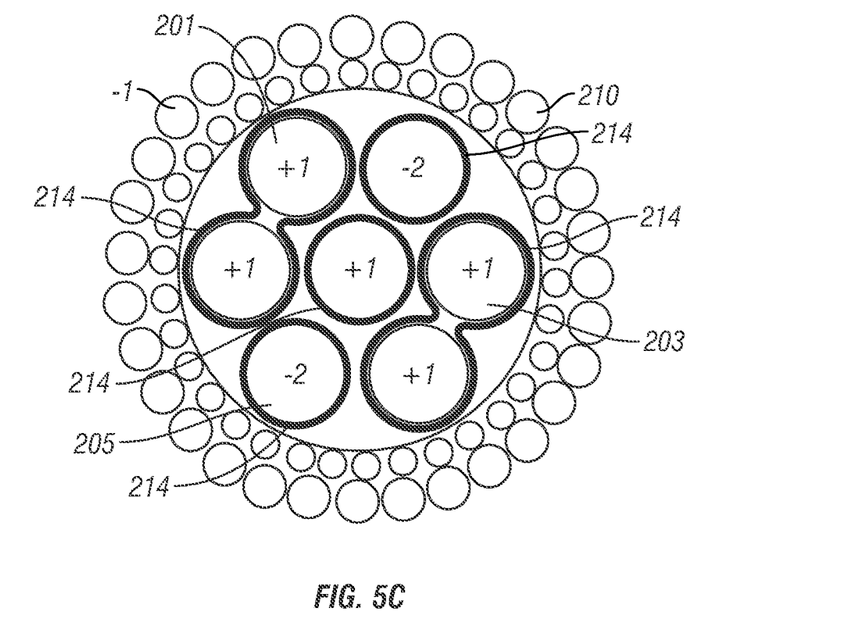
Figure 5D:
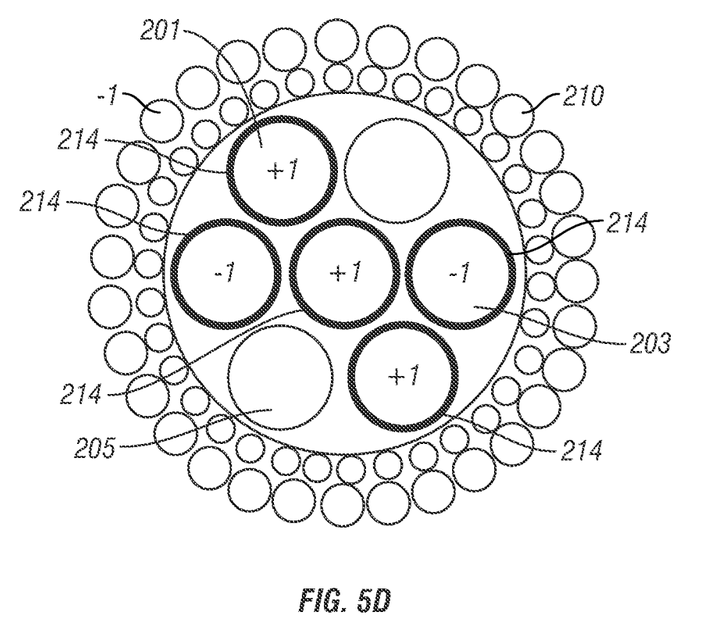
Figure 5E:
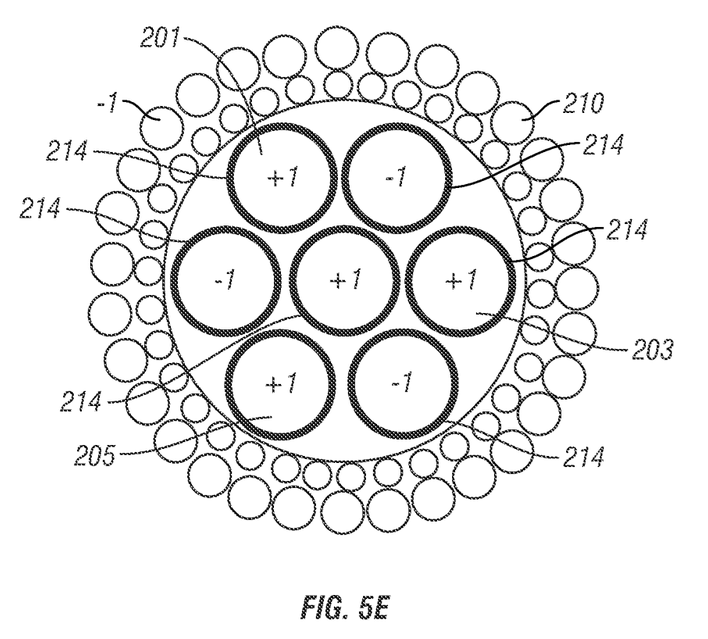

The magnetic permeable insulation 214 may be applied to the conductors 201-207 in various configurations depending on the transmission modes to reduce the crosstalk as depicted in FIGS. 4A-4H. For example, FIG. 4A shows the conductor pair 201 and 206 insulated by a layer of the magnetic permeable insulation 214 covering the pair of conductors for the transmission mode M2. A similar layer of the magnetic permeable insulation 214 covers the conductor pair 203 and 204. In FIGS. 4B, E, and F, each circumferentially spaced conductor 201-206 is separately insulated with the magnetic permeable insulation 214 for transmission modes M3, M6, and M7, respectively. Similar to FIG. 4A, the conductor pairs 201, 206, 203, and 204 are covered with separate layers of the magnetic permeable insulation 214 as well as the conductors 202 and 205 being insulated separately with the magnetic permeable insulation 214 for transmission mode M2. As an alternative to FIG. 4F for mode M7, the central conductor 207 may be the only conductor insulated with the magnetic permeable insulation 214 as depicted in FIG. 4H. It should be understood that although the wireline cable 200 may be configured to reduce crosstalk and attenuation for one or more transmission modes, the wireline cable 200 may also be operated in other transmission modes as well.

In order to increase the bandwidth or power transmitted, multiple simultaneous transmission modes may be applied across the wireline cable 200. For example, FIGS. 5A-5E show cross-section views of the wireline cable 200 being operated with multiple simultaneous transmission modes as well as the placement of the magnetic permeable insulation 214 to reduce crosstalk. As shown, the multiple simultaneous transmission modes depicted are modes M2 and M8; modes M3 and M8; modes M4 and M8; modes M5 and M8; and modes M6 and M8 in FIGS. 5A-5E, respectively. The transmission mode M8 is employed for all the multiple transmission modes depicted in FIGS. 5A-5E, and as such voltages of equal magnitude and opposite polarities are applied to the central conductor 207 and armor 210. For the multi-mode applications, the central conductor 207 as well as one or more of the circumferentially spaced conductors 201-206 are insulated with the magnetic permeable insulation 214 to reduce crosstalk while the multiple transmission modes are being employed.

It should be appreciated that the wireline cable 200 employing the magnetic permeable insulation as described herein reduces the attenuation of the electrical signal and reduces crosstalk among the conductors, yielding a wireline cable suitable for providing communication paths for data and power along cable lengths up to 40,000 feet (12,192 meters).

In addition to the embodiments described above, many examples of specific combinations are within the scope of the disclosure, some of which are detailed below:

Example 1

A wireline cable, comprising:
insulated conductors, arranged such that circumferentially spaced conductors surround a central conductor, wherein one or more of the conductors is insulated with a magnetic permeable insulation configured to reduce electrical interference with an adjacent conductor.

Example 2

The wireline cable of example 1, wherein the magnetic permeable insulation comprises a relative magnetic permeability of any one of 9 to 110, 9 to 160, or 1 to 7000.

Example 3

The wireline cable of example 1, wherein the magnetic permeable insulation comprises a ferrite polymer.

Example 4

The wireline cable of example 1, further comprising layers of helically wound armor that enclose the insulated conductors.

Example 5

The wireline cable of example 1, wherein the one or more conductors insulated with the magnetic permeable insulation is the central conductor.

Example 6

The wireline cable of example 1, wherein the one or more conductors insulated with the magnetic permeable insulation include a pair of adjacent circumferentially spaced conductors insulated by a layer of the magnetic permeable insulation covering the pair of conductors.

Example 7

The wireline cable of example 6, wherein the one or more conductors insulated with the magnetic permeable insulation include a second pair of adjacent circumferentially spaced conductors insulated by another layer of the magnetic permeable insulation covering the second pair of conductors.

Example 8

The wireline cable of example 7, wherein the one or more conductors insulated with the magnetic permeable insulation include two of the circumferentially spaced conductors, which separately insulated with the magnetic permeable insulation and spaced opposite of each other.

Example 9

The wireline cable of example 1, wherein each circumferentially spaced conductor is separately insulated with the magnetic permeable insulation.

Example 10

The wireline cable of example 1, wherein four of the circumferentially spaced conductors are each separately insulated with the magnetic permeable insulation.

Example 11

The wireline cable of example 1, wherein the one or more conductors insulated with the magnetic permeable insulation includes the central conductor and one or more of the circumferentially spaced conductors.

Example 12

A method of transmitting signals over a wireline cable, comprising:
applying voltages to insulated conductors of the wireline cable to transmit the signals, wherein the insulated conductors comprise circumferentially spaced conductors surrounding a central conductor, and one or more of the conductors is insulated with a magnetic permeable insulation to reduce electrical interference with an adjacent conductor; and
receiving the signals at a downhole tool coupled to the wireline cable.

Example 13

The method of example 12, wherein applying voltages to the insulated conductors comprises applying a first voltage to the central conductor and a second voltage to the circumferentially spaced conductors.

Example 14

The method of example 12, wherein the first and second voltages have equal magnitudes and opposite polarities.

Example 15

The method of example 12, wherein the magnetic permeable insulation comprises a relative magnetic permeability of any one of 9 to 110, 9 to 160, or 1 to 7000.

Example 16

The method of example 12, wherein the magnetic permeable insulation comprises a ferrite polymer including ferrite powder.

Example 17

The method of example 12, wherein the one or more conductors insulated with the magnetic permeable insulation is the central conductor.

Example 18

The method of example 12, wherein applying voltages includes applying at least two simultaneous transmission modes to the cable, and wherein the one or more conductors insulated with the magnetic permeable insulation includes the central conductor and one or more of the circumferentially spaced conductors.

Example 19

A wireline system, comprising:
a controller;
a downhole tool locatable in a borehole;
a wireline cable coupled to the downhole tool and operable to provide power and an electrical communication path for the downhole tool, the wireline cable comprising:
insulated conductors, arranged such that circumferentially spaced conductors surround a central conductor, wherein one or more of the conductors is insulated with a magnetic permeable insulation configured to reduce electrical interference with an adjacent conductor.

Example 20

The wireline system of example 19, wherein the one or more conductors insulated with the magnetic permeable insulation includes the central conductor and one or more of the circumferentially spaced conductors.

This discussion is directed to various embodiments of the present disclosure. The drawing figures are not necessarily to scale. Certain features of the embodiments may be shown exaggerated in scale or in somewhat schematic form and some details of conventional elements may not be shown in the interest of clarity and conciseness. Although one or more of these embodiments may be preferred, the embodiments disclosed should not be interpreted, or otherwise used, as limiting the scope of the disclosure, including the claims. It is to be fully recognized that the different teachings of the embodiments discussed may be employed separately or in any suitable combination to produce desired results. In addition, one skilled in the art will understand that the description has broad application, and the discussion of any embodiment is meant only to be exemplary of that embodiment, and not intended to suggest that the scope of the disclosure, including the claims, is limited to that embodiment.

Certain terms are used throughout the description and claims to refer to particular features or components. As one skilled in the art will appreciate, different persons may refer to the same feature or component by different names. This document does not intend to distinguish between components or features that differ in name but not function, unless specifically stated. In the discussion and in the claims, the terms "including" and "comprising" are used in an open-ended fashion, and thus should be interpreted to mean "including, but not limited to . . . ." Also, the term "couple" or "couples" is intended to mean either an indirect or direct connection. In addition, the terms "axial" and "axially" generally mean along or parallel to a central axis (e.g., central axis of a body or a port), while the terms "radial" and "radially" generally mean perpendicular to the central axis. The use of "top," "bottom," "above," "below," and variations of these terms is made for convenience, but does not require any particular orientation of the components.

Reference throughout this specification to "one embodiment," "an embodiment," or similar language means that a particular feature, structure, or characteristic described in connection with the embodiment may be included in at least one embodiment of the present disclosure. Thus, appearances of the phrases "in one embodiment," "in an embodiment," and similar language throughout this specification may, but do not necessarily, all refer to the same embodiment.

Although the present invention has been described with respect to specific details, it is not intended that such details should be regarded as limitations on the scope of the invention, except to the extent that they are included in the accompanying claims.

What is claimed is:

1. A wireline cable, comprising insulated conductors arranged such that circumferentially spaced conductors surround a central conductor, wherein one or more of the conductors is insulated with a magnetic permeable insulation configured to reduce crosstalk between transmission modes during high frequency data signal communication through the conductors, and wherein which conductors are insulated depends on the transmission modes used.

2. The wireline cable of claim 1, wherein the magnetic permeable insulation comprises a relative magnetic permeability of any one of 9 to 110, 9 to 160, or 1 to 7000.

3. The wireline cable of claim 1, wherein the magnetic permeable insulation comprises a ferrite polymer.

4. The wireline cable of claim 1, further comprising layers of helically wound armor that enclose the insulated conductors.

5. The wireline cable of claim 1, wherein the one or more conductors insulated with the magnetic permeable insulation is the central conductor.

6. The wireline cable of claim 1, wherein the one or more conductors insulated with the magnetic permeable insulation include a pair of adjacent circumferentially spaced conductors insulated by a layer of the magnetic permeable insulation covering the pair of conductors.

7. The wireline cable of claim 6, wherein the one or more conductors insulated with the magnetic permeable insulation include a second pair of adjacent circumferentially spaced conductors insulated by another layer of the magnetic permeable insulation covering the second pair of conductors.

8. The wireline cable of claim 7, wherein the one or more conductors insulated with the magnetic permeable insulation include two of the circumferentially spaced conductors, which separately insulated with the magnetic permeable insulation and spaced opposite of each other.

9. The wireline cable of claim 1, wherein each circumferentially spaced conductor is separately insulated with the magnetic permeable insulation.

10. The wireline cable of claim 1, wherein four of the circumferentially spaced conductors are each separately insulated with the magnetic permeable insulation.

11. The wireline cable of claim 1, wherein the one or more conductors insulated with the magnetic permeable insulation includes the central conductor and one or more of the circumferentially spaced conductors.

12. A method of transmitting data signals over a wireline cable, comprising:
  applying voltages to insulated conductors of the wireline cable to transmit the data signals with high frequency in transmission modes, wherein the insulated conductors comprise circumferentially spaced conductors surrounding a central conductor;
  reducing crosstalk between transmission modes involving adjacent conductors during communication by insulating one or more of the conductors with a magnetic permeable insulation, which conductors being insulated depending on the transmission modes used, and
  receiving the signals at a downhole tool coupled to the wireline cable.

13. The method of claim 12, wherein applying voltages to the insulated conductors comprises applying a first voltage to the central conductor and a second voltage to the circumferentially spaced conductors.

14. The method of claim 12, wherein the first and second voltages have equal magnitudes and opposite polarities.

15. The method of claim 12, wherein the magnetic permeable insulation comprises a relative magnetic permeability of any one of 9 to 110, 9 to 160, or 1 to 7000.

16. The method of claim 12, wherein the magnetic permeable insulation comprises a ferrite polymer including ferrite powder.

17. The method of claim 12, wherein the one or more conductors insulated with the magnetic permeable insulation is the central conductor.

18. The method of claim 12, wherein applying voltages includes applying at least two simultaneous transmission modes to the cable, and wherein the one or more conductors insulated with the magnetic permeable insulation includes the central conductor and one or more of the circumferentially spaced conductors.

19. A wireline system, comprising:
- a controller;
- a downhole tool locatable in a borehole; and
- a wireline cable coupled to the downhole tool and operable to provide power and an electrical communication path for data for the downhole tool, the wireline cable comprising insulated conductors arranged such that circumferentially spaced conductors surround a central conductor, wherein one or more of the conductors is insulated with a magnetic permeable insulation configured to reduce crosstalk between transmission modes during high frequency data signal communication through the conductors, and wherein which conductors are insulated depends on the transmission modes used.

20. The wireline system of claim 19, wherein the one or more conductors insulated with the magnetic permeable insulation includes the central conductor and one or more of the circumferentially spaced conductors.

* * * * *

UNITED STATES PATENT AND TRADEMARK OFFICE
CERTIFICATE OF CORRECTION

PATENT NO. : 11,483,952 B2
APPLICATION NO. : 15/768993
DATED : October 25, 2022
INVENTOR(S) : George David Goodman and Sudhir Gupta It is certified that error appears in the above-identified patent and that said Letters Patent is hereby corrected as shown below:

On the Title Page

Item (71), should reflect "Halliburton Energy Services, Inc." as the sole applicant. "Dea Goodman" should be removed.

Signed and Sealed this
Twenty-seventh Day of December, 2022

*Katherine Kelly Vidal*

Katherine Kelly Vidal
*Director of the United States Patent and Trademark Office*